(12) United States Patent
Assefa et al.

(10) Patent No.: US 8,304,272 B2
(45) Date of Patent: Nov. 6, 2012

(54) GERMANIUM PHOTODETECTOR

(75) Inventors: Solomon Assefa, Ossining, NY (US);
Jeehwan Kim, White Plains, NY (US);
Jin-Hong Park, Fishkill, NY (US);
Yurii A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/024,724

(22) Filed: Feb. 10, 2011

(65) Prior Publication Data
US 2012/0001283 A1 Jan. 5, 2012

Related U.S. Application Data

(60) Provisional application No. 61/361,034, filed on Jul. 2, 2010.

(51) Int. Cl.
*H01L 21/00* (2006.01)
(52) U.S. Cl. ............................................. 438/48; 438/479
(58) Field of Classification Search ............... 438/48, 438/479
See application file for complete search history.

(56) References Cited

U.S. PATENT DOCUMENTS

| | | | |
|---|---|---|---|
| 2,793,179 A | 5/1957 | De La Breteque | |
| 3,677,918 A | 7/1972 | Miyake | |
| 5,744,849 A | 4/1998 | Sugawa | |
| 5,871,630 A | 2/1999 | Bhattacharya et al. | |
| 6,528,794 B1 | 3/2003 | Sato | |
| 7,297,868 B2 | 11/2007 | Bhattacharya | |
| 7,405,098 B2* | 7/2008 | Lee et al. | 438/48 |
| 7,498,243 B2 | 3/2009 | Liu et al. | |
| 7,507,321 B2 | 3/2009 | Aksu et al. | |
| 7,515,793 B2 | 4/2009 | Dehlinger et al. | |
| 7,875,522 B2 | 1/2011 | Kapur et al. | |
| 2006/0151331 A1 | 7/2006 | Taunier et al. | |
| 2007/0004067 A1 | 1/2007 | Hsu et al. | |
| 2007/0018270 A1 | 1/2007 | Leon et al. | |
| 2007/0166964 A1 | 7/2007 | Basol | |
| 2007/0262296 A1* | 11/2007 | Bauer | 257/19 |
| 2008/0230395 A1 | 9/2008 | Inbe et al. | |

(Continued)

FOREIGN PATENT DOCUMENTS
WO    WO2009052479 A2    4/2009

OTHER PUBLICATIONS

International Search Report and Written Opinion issued in International Application No. PCT/EP2011/063558 dated Jan. 3, 2012; 17 pages.

(Continued)

*Primary Examiner* — Douglas Menz
(74) *Attorney, Agent, or Firm* — Cantor Colburn LLP; Vazken Alexanian

(57) ABSTRACT

A method for forming a photodetector device includes forming an insulator layer on a substrate, forming a germanium (Ge) layer on the insulator layer and a portion of the substrate, forming a second insulator layer on the Ge layer, implanting n-type ions in the Ge layer, patterning the n-type Ge layer, forming a capping insulator layer on the second insulator layer and a portion of the first insulator layer, heating the device to crystallize the Ge layer resulting in an single crystalline n-type Ge layer, and forming electrodes electrically connected to the single crystalline n-type Ge layer.

5 Claims, 8 Drawing Sheets

U.S. PATENT DOCUMENTS

| | | |
|---|---|---|
| 2009/0108384 A1 | 4/2009 | Assefa et al. |
| 2009/0283415 A1 | 11/2009 | Aksu et al. |
| 2010/0140098 A1 | 6/2010 | Uzoh et al. |
| 2010/0213073 A1 | 8/2010 | Huang et al. |
| 2011/0108115 A1 | 5/2011 | Deligianni et al. |

OTHER PUBLICATIONS

K. Toko et al., "Defect-Free single-crystal Ge island arrays on insulator by rapid-melting-growth combined with seed-positioning technique," Applied Physics Letters 95, 112107; Sep. 18, 2009, pp. 1-3.

M. Miyao et al., "High-quality single-cyrstal Ge stripes on quartz substrate by rapid-melting-growth," Applied Physics Letters 95, 022115; Jul. 17, 2009, pp. 1-3.

International Search Report; International Application No. PCT/EP2011/060377; International Filing Date: Jun. 21, 2011; Date of Mailing: Jan. 6, 2012.

International Search Report—Written Opinion; International Application No. PCT/EP2011/060377; International Filing Date: Jun. 21, 2011; Date of Mailing: Jan. 6, 2011.

S. Assefa, et al., "CMOS-Integrated Optical Receivers for On-Chip Interconnects," IEEE Journal of Selected Topics in Quantum Electronics, vol. 16, No. 5, Sep./Oct. 2010, pp. 1376-1385.

S. Assefa, et al., "Reinventing Germanium Avalanche Photodetector for Nanophotonic On-Chip Optical Interconnects," Copyright 2010, Macmillan Publisher Limited, vol. 464, No. 4, Mar. 4, 2010, Nature, pp. 80-85.

S. Assefa, et al., "CMOS-Integrated High-Speed MSM Germanium Waveguide Photodetector," Optics Express, Mar. 1, 2010, vol. 18, No. 5, Copyright 2010 OSA, pp. 1-14.

S. Assefa, et al., "CMOS-Integrated 40GHz Germanium Waveguide Photodetector for On-Chip Optical Interconnects," 2009 Conference on Optical Fiber Communication, copyright 2009 IEEE, pp. 1-3.

S. Wolf, et al., "Ion Implantation for VLSI," Silicon Processinf for the VLSI Era, vol. 1, Lattice Press, Copyright 1986, pp. 280-330.

V. A. Vu, et al., "PIN Germanium Photodetector Fabrication Issues and Manufacturability," IEEE Transactions on Semiconductor Manufacturing, vol. 23, No. 3, Aug. 2010, pp. 411-418.

Andreoli, P., et al. "Electrochemical approaches to GaAs1-xSbx thin films" Journal of Electroanalytical Chemistry 385 (1995), (c) 1995 Elsevier Science S.A., pp. 265-268.

Bockris, J. O'M. et al. "Electrodeposition of Gallium on Liquid and Solid Gallium Electrodes in Alkaline Solutions", Supplied by The British Library—Journal of the Electrochemical Society, Jan. 1962, pp. 48-58.

Chen, W.S., et al "Development of thin film polycrystalline CuIn1-xGaxSe2 solar cells," 19th IEEE Photovoltaic Specialists Conference, New Orleans, LA, May 4-8, 1987, Proceedings (A88-34226 13-44), 1987, pp. 1445-1447.

Flamini, D.O., et al. "Electrodeposition of gallium onto vitreous carbon", Accepted Nov. 6, 2006, published online: Jan. 5, 2007; J. Appl. Electrochem (2007); 37, pp. 467-471.

Sundararajan, S. et al. "The Electrodeposition of Gallium from a Chloride Bath", Journal of the Less-Common Metals, II, pp. 360-364.

\* cited by examiner

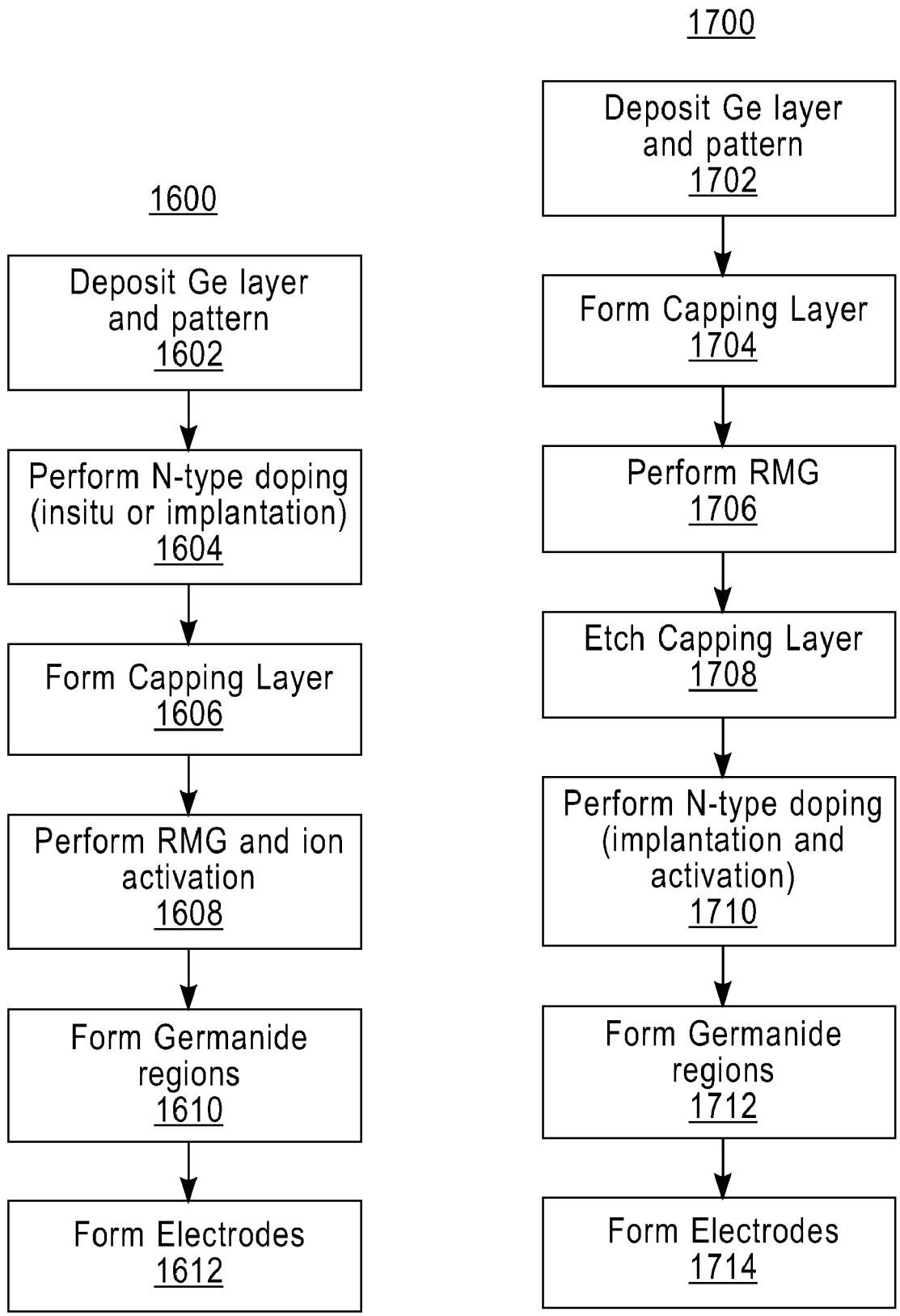

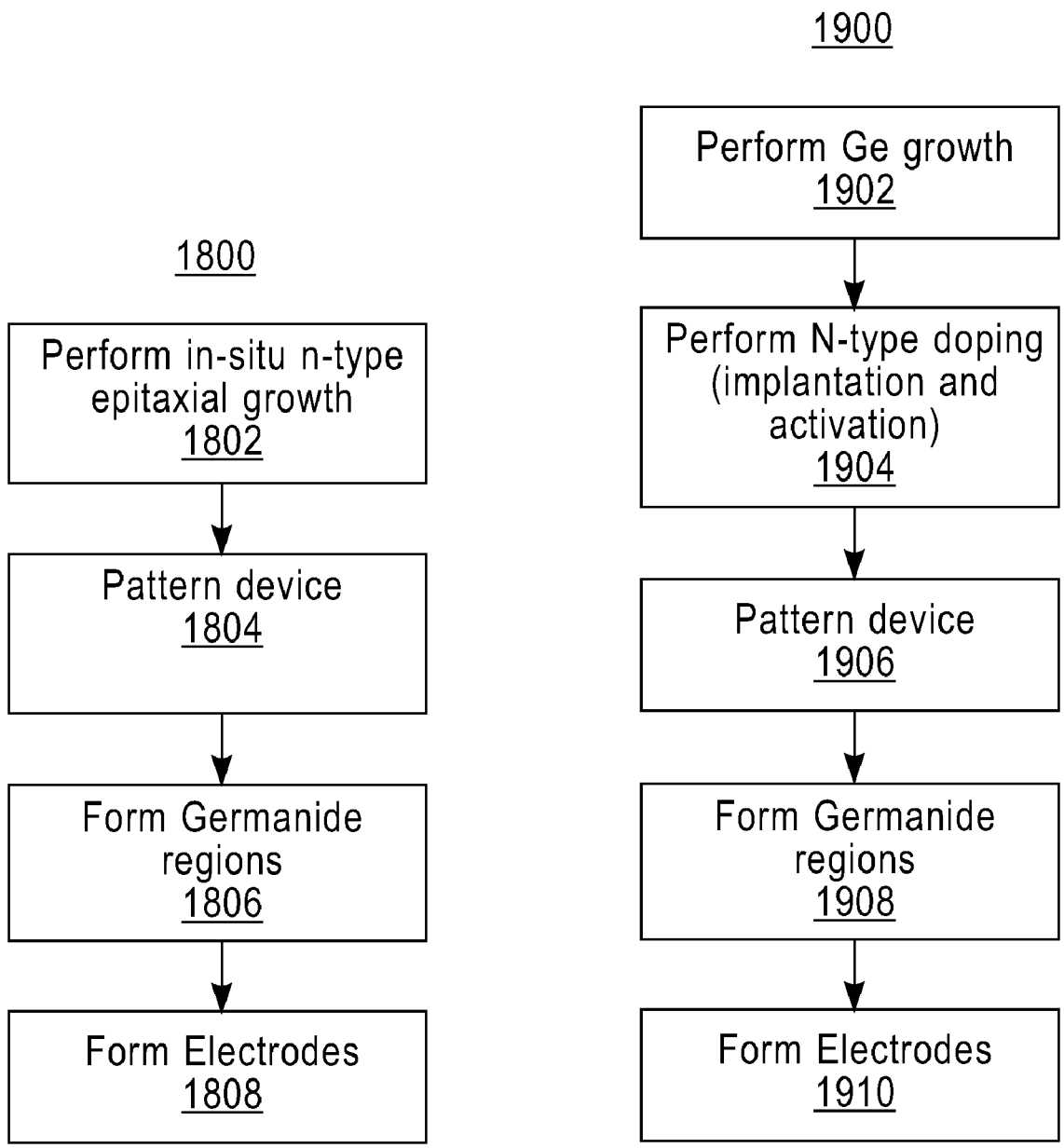

GERMANIUM PHOTODETECTOR

CROSS REFERENCE TO RELATED APPLICATIONS

This application claims the benefit of U.S. Provisional Application No. 61/361,034, filed Jul. 2, 2010.

FIELD OF INVENTION

The present invention relates to photodetectors.

DESCRIPTION OF RELATED ART

Photodetectors are devices that output a current when exposed to a light source. Previous metal-semiconductor-metal (MSM) junction photodetectors included an intrinsic germanium (Ge) layer and a pair of electrodes.

BRIEF SUMMARY

According to one embodiment of the present invention, a method for forming a photodetector device includes forming an insulator layer on a substrate, forming a germanium (Ge) layer on the insulator layer and a portion of the substrate, forming a second insulator layer on the Ge layer, implanting n-type ions in the Ge layer, patterning the n-type Ge layer, forming a capping insulator layer on the second insulator layer and a portion of the first insulator layer, heating the device to crystallize the n-type Ge layer resulting in an single crystalline n-type Ge layer, and forming electrodes electrically connected to the single crystalline n-type Ge layer.

According to an alternate embodiment of the present invention a method for forming a photodetector device includes forming an insulator layer on a substrate, forming a germanium (Ge) layer on the insulator layer and a portion of the substrate, forming a second insulator layer on the Ge layer, patterning the Ge layer, forming a capping insulator layer on the second insulator layer and a portion of the first insulator layer, heating the device to crystallize the Ge layer resulting in an single crystalline Ge layer, implanting n-type ions in the single crystalline Ge layer, heating the device to activate n-type ions in the single crystalline Ge layer, and forming electrodes electrically connected to the single crystalline n-type Ge layer.

According to another alternate embodiment of the present invention, a method for forming a photodetector device includes epitaxially forming an single crystalline n-type Ge layer on a substrate, forming a first insulator layer on the single crystalline n-type Ge layer, patterning the single crystalline n-type Ge layer, and forming electrodes electrically connected to the single crystalline n-type Ge layer.

According to yet another alternate embodiment of the present invention, a method for forming a photodetector device includes epitaxially forming an single crystalline Ge layer on a substrate, forming a first insulator layer on the single crystalline Ge layer, implanting n-type ions in the single crystalline Ge layer to form a single crystalline n-type Ge layer, activating the n-type ions in the single crystalline Ge layer, and forming electrodes electrically connected to the single crystalline n-type Ge layer.

According to yet another alternate embodiment of the present invention a photodetector device comprises a substrate, a single crystalline n-type doped germanium (Ge) layer grown on the substrate, an insulator layer deposited on the a single crystalline n-type doped Ge layer, and a pair of electrodes electrically connected to the a single crystalline n-type doped germanium (Ge) layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 16 illustrates a block diagram including an exemplary method for forming a device that is similar to the method described above in FIGS. 1-5.

FIG. 17 illustrates a block diagram including an exemplary method for forming a device that is similar to the method described above in FIGS. 6-10.

FIG. 18 illustrates a block diagram including an exemplary method for forming a device that is similar to the method described above in FIGS. 11-12.

FIG. 19 illustrates a block diagram that includes an exemplary method for forming a device that is similar to the method described above in FIGS. 13-15.

DETAILED DESCRIPTION

Previous photodetectors may have included a layer of intrinsic germanium. The intrinsic germanium results in a high electric field in the photodetector that increases the bandwidth of the photodetector. Defects in the intrinsic germanium result in the intrinsic germanium operating as a p-type doped substance (with approximately $10^{14}$ cm$^{-3}$ of p-type material). This characteristic of intrinsic germanium results in the majority carrier of the device being hole with a low hole barrier resulting in an undesirably high dark current for MSM devices. It is desirable for a device to include n-type germanium having a low concentration of n-type doping (greater than $10^{14}$ cm$^{-3}$) The low concentration of n-type doping allows a high electric field that increases the bandwidth of the device. The methods described below result in a germanium that is n-type doped in a low concentration that changes the majority carrier to electron with a high electron barrier and reduces the dark current of the device. Optimizing the formation of germanide in the device may also reduce dark current.

Figure 1:
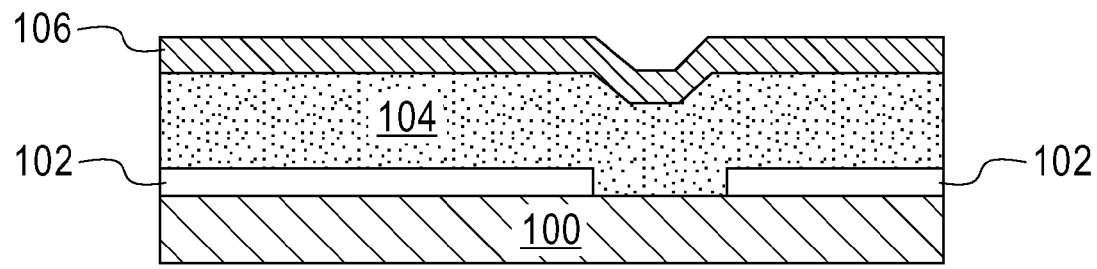
FIGS. 1-5 illustrate a side cut-away view of an exemplary method for forming a photodetector.

FIGS. 1-5 illustrate a side cut-away view of an exemplary method for forming a photodetector device. Referring to FIG. 1, an insulator layer 102 such as, for example, an oxide or nitride material is patterned on a substrate 100. The substrate may include, for example, a single crystalline silicon material such as Si, SiGe, and may be formed as a silicon wave guide. A layer of germanium (Ge layer) 104 is formed on the insulator layer 102 and the exposed portion of the substrate 100. The Ge layer 104 may include, for example, amorphous Ge or poly-germanium either of which may be for example intrinsic, p-type, or counter doped. The Ge layer 104 may be formed by, for example, a chemical vapor deposition process, a physical vapor deposition process, or a plasma enhanced chemical vapor deposition process. An insulator layer 106 is formed on the Ge 104 layer. The insulator layer 106 may include, for example, a silicon nitride or silicon oxide material.

Figure 2:
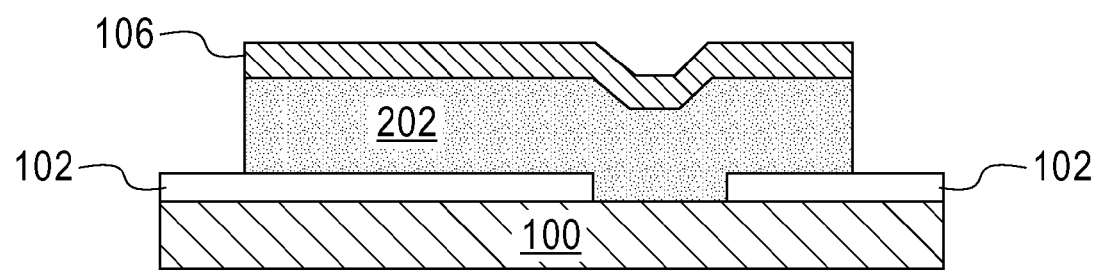

FIG. 2 illustrates the resultant structure following the patterning and etching of portions of the insulator layer 106 and Ge layer 104 (of FIG. 1) using, for example, a dry etching process that exposes portions of the insulator layer 102. The Ge layer 104 has been implanted with n-type ions such as, for example, P, As, or Sb resulting in an n-typed Ge material 202. The n-typed Ge material 202 may be formed by implantation following the formation of the Ge layer 104.

Figure 3:
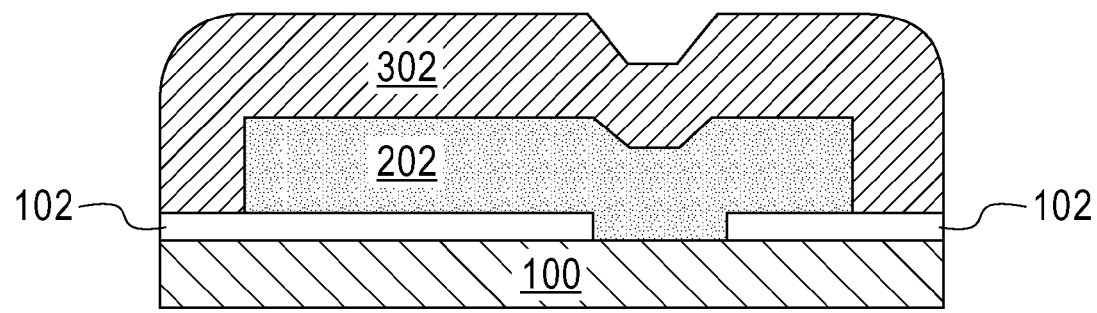

FIG. 3 illustrates the resultant structure following the formation of an insulator capping layer 302 over the insulator layer 106 (of FIG. 2) and the exposed portions of the insulator layer 102. The insulator capping layer 302 may include, for example, a silicon oxide or silicon nitride material that may be formed by, for example, a low pressure chemical vapor deposition (LPCVD) process, or a plasma enhanced chemical vapor deposition (PECVD) process.

Figure 4:
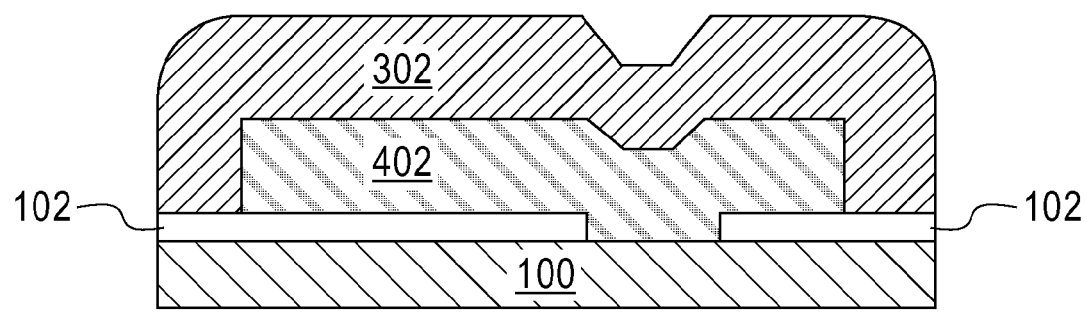

FIG. 4 illustrates the resultant structure following a rapid melting growth (RMG) process that heats the device resulting in the activation of the n-type ions in the n-typed Ge material 202 (of FIG. 4) and the crystallization of the n-typed Ge material 202 into a single crystalline n-type Ge material 402. The RMG process includes, for example, heating the n-typed Ge material 202 to at least the melting point of the n-typed Ge material 202 (937° C.) for a brief period (e.g., less than 1 second), which melts the material 202. The heating process may include, for example, a rapid thermal annealing or a laser annealing process. When the temperature decreases in the material 202, crystalline orientation of the material 202 aligns with the orientation of the single crystalline Si substrate 100 as the material 202 cools and solidifies. In alternate embodiments, the n-typed Ge material 202 may be formed by epitaxial growth and in-situ doping of the n-type ions during the epitaxial growth process.

Figure 5:
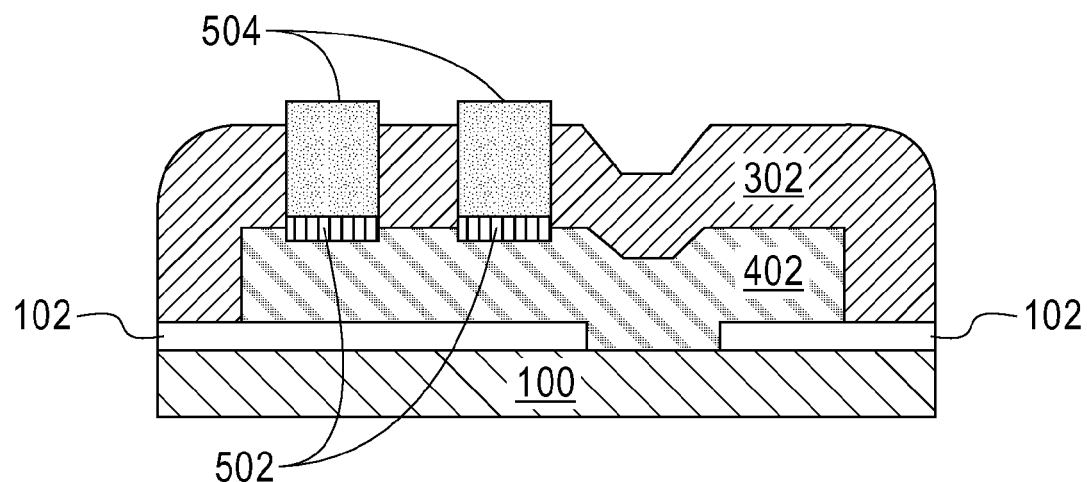

FIG. 5 illustrates the resultant structure following the patterning and removal of regions of the insulator capping layer 302 by, for example, an anisotropic etching process to form a cavity that exposes portions of the single crystalline n-type Ge material 402. Germanide regions 502 are formed in the exposed portions of the single crystalline n-type Ge material 402. The germanide regions 502 are formed by forming a metal layer on the exposed portions of the single crystalline n-type Ge material 402 and heating the device such that metal diffuses into the single crystalline n-type Ge material 402 forming germanide. The selection of the metal material, and the temperature used to promote diffusing and sintering may be tailored to optimize properties of the device. For example for a germanide formed with titanium (Ti), may be diffused into and sintered with Ge at above 300° C. The higher temperature used for diffusion and sinter results in a higher resistivity in the device because Ti germanide formed at below 450° C. has a higher resistivity than Ti. Different materials such as, for example, Ni, Pd, Pt, Ta, Cu, W, Co, Zr, and Mo may be used to form a germanide at a variety of temperatures. By selecting the material and temperatures used for diffusion and sinter when forming the germanide, the barrier height and contact resistance in the device may be optimized to meet design specifications. Once the germanide regions 502 are formed, electrodes 504 may be formed on the germanide regions 502 and in the cavity in the insulator capping layer 302. The electrodes 504 may be formed from, for example, titanium, copper, or a metallic alloy.

Figure 6:
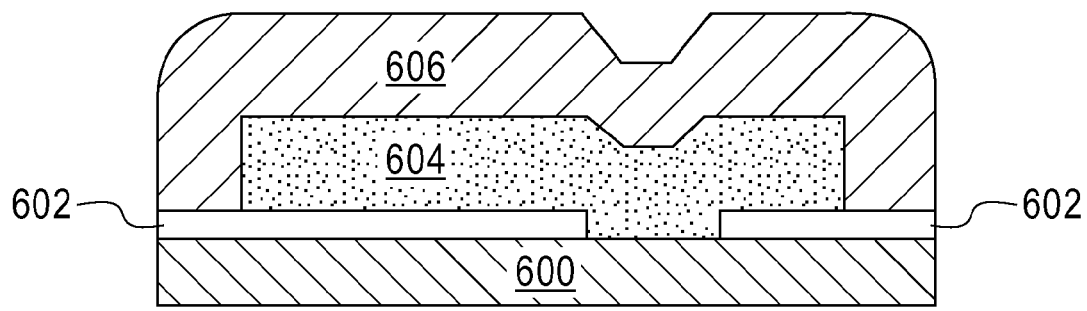
FIGS. 6-10 illustrate side cut-away views of an alternate exemplary method for forming a photodetector device.

FIGS. 6-10 illustrate side cut-away views of an alternate exemplary method for forming a photodetector device. The materials and methods used to form the structure of FIG. 6 are similar to the methods and materials described above in FIG. 1. Referring to FIG. 6, an insulator layer 602 such as, for example, an oxide or nitride material is patterned on the substrate 600. The substrate may include, for example, a single crystalline silicon material such as Si, SiGe, and may be formed as a silicon wave guide. A Ge layer 604 is formed on the insulator layer 602 and the exposed portion of the substrate 600. An insulator capping layer 606 is formed over the layer of Ge 604 and the exposed portions of the insulator layer 602. The insulator capping layer 606 may include, for example, a silicon oxide or silicon nitride material.

Figure 7:
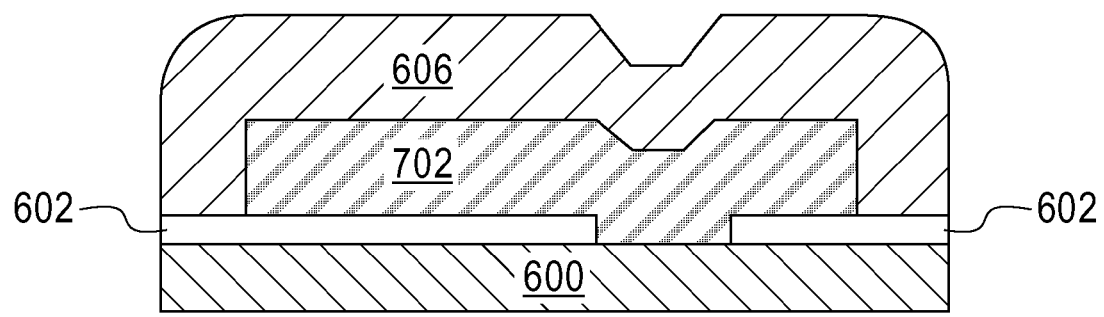

FIG. 7 illustrates the resultant structure following an RMG process that results in the crystallization of the layer of Ge 604 material into a single crystalline Ge material 702.

Figure 8:
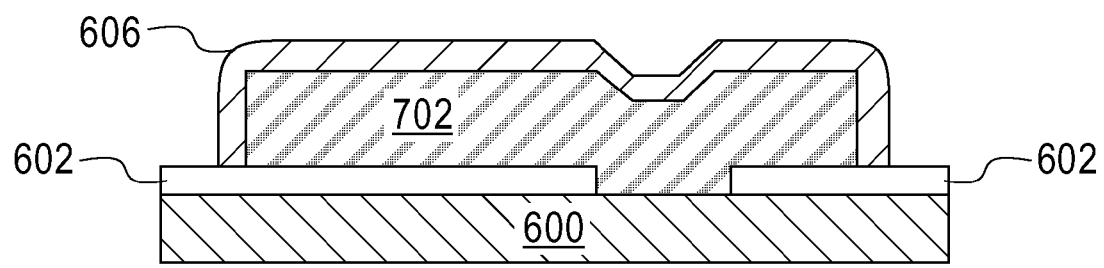

FIG. 8 illustrates the resultant structure following the removal of portions insulator capping layer 606 by, for example, an anisotropic etching process.

Figure 9A:
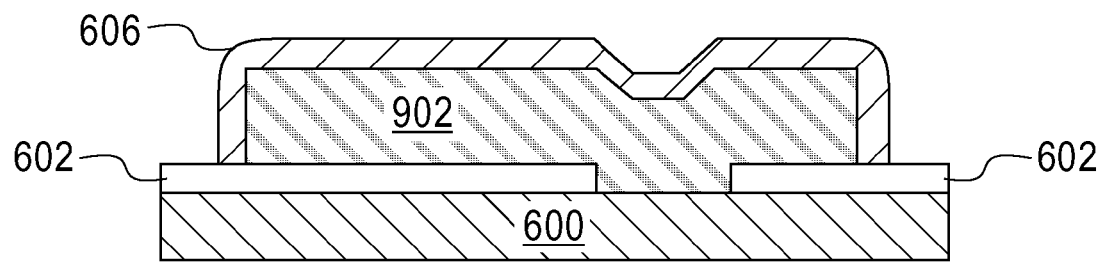

FIG. 9A illustrates the resultant structure following the implantation and activation of n-type ions (of FIG. 7) resulting in a single crystalline n-type Ge material 902.

As discussed above, defects in the intrinsic germanium result in the intrinsic germanium operating as a p-type doped substance (with approximately $10^{14}$ cm$^{-3}$ of p-type material). It may be desirable to implant a low concentration of n-type ions in the single crystalline intrinsic Ge material 702 that allows the device to have a high electric field, and thus, an increased bandwidth. However, if the n-type ions are implanted in an insufficient dose, the concentration of n-type ions will not overcome concentration the p-type ions. Alternatively, if the n-type ion concentration is too high, the device may exhibit undesirable properties.

Figure 9B:
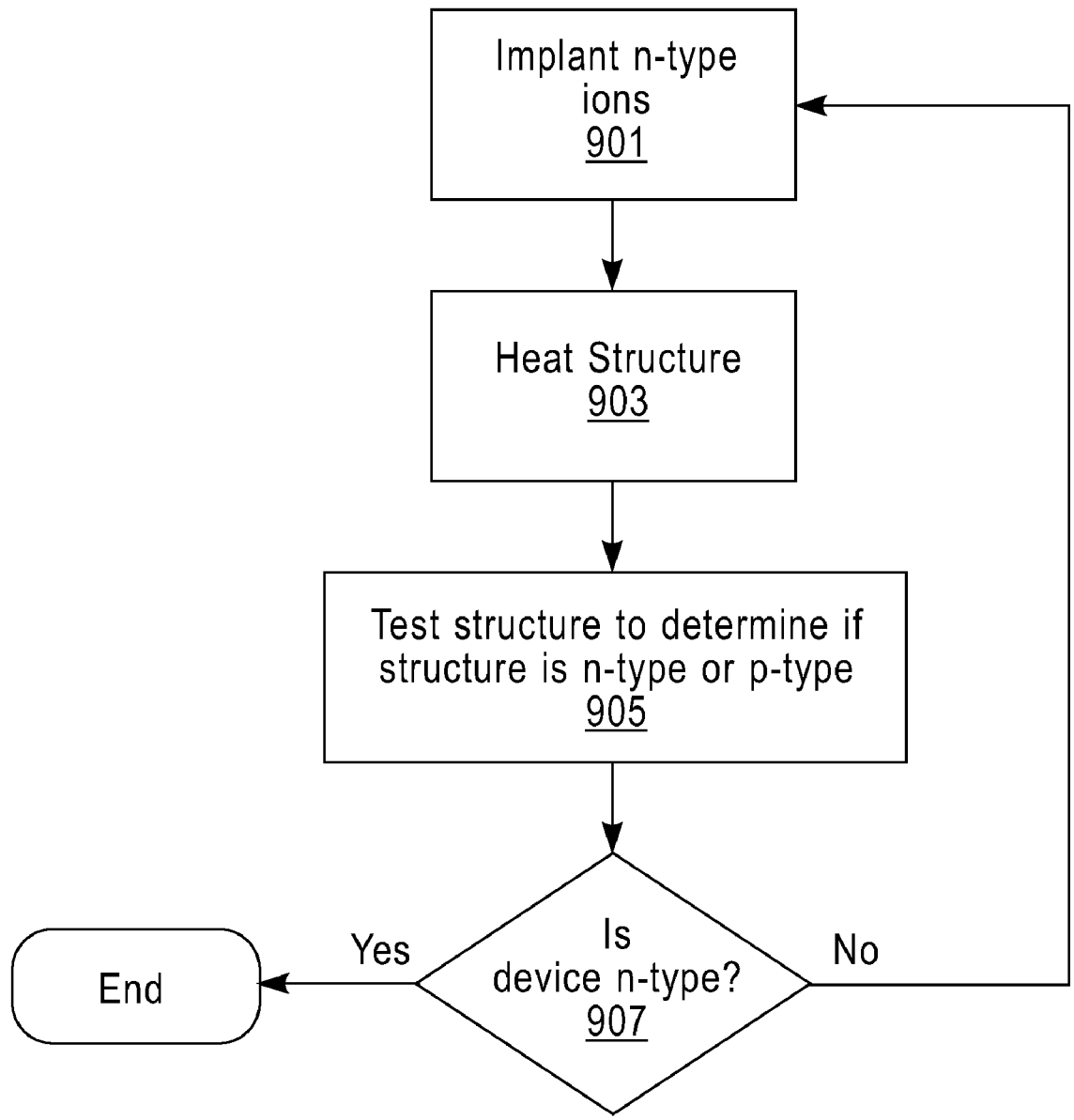

An exemplary method for implanting and activating a low concentration of n-type ions is illustrated by a block diagram in FIG. 9B. Referring to FIG. 9B, in block 901, a low dose of n-type ions such as, for example, approximately $10^{11}$ cm$^{-2}$ is implanted in the single crystalline Ge material 702 (of FIG. 7). In block 903, the n-type dopants are activated by applying heat to the structure. In block 905, the structure may be measured by an analytical device such as, for example, a hot probe to determine whether the device is an n-type device or a p-type device. In block 907, if the device is an n-type device, the implantation and activation process ends. If the device is not an n-type device, the process is repeated beginning in block 901.

Figure 10:
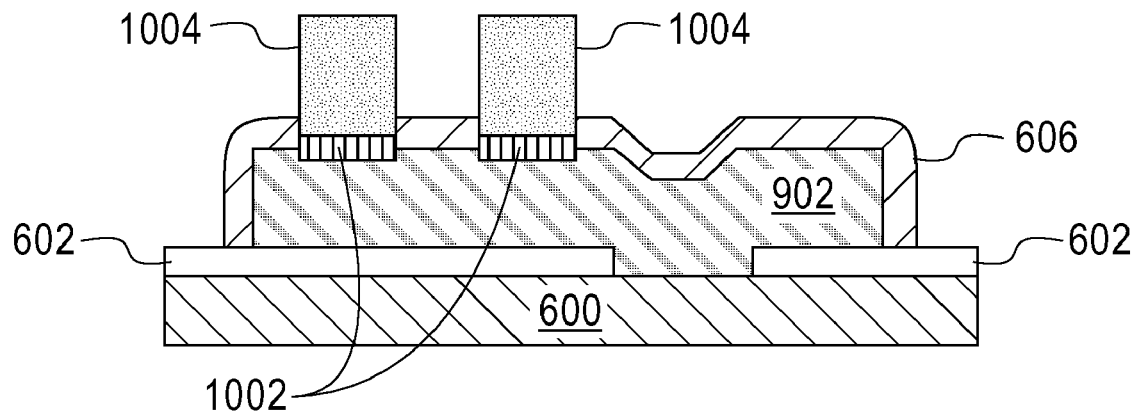

FIG. 10 illustrates the resultant structure following the patterning and removal of portions of the insulator capping layer 606 to form cavities that expose portions of the single crystalline n-type Ge material 902. Germanide regions 1002 and electrode material 1004 are formed in a similar manner as described above in FIG. 5.

Figure 11:
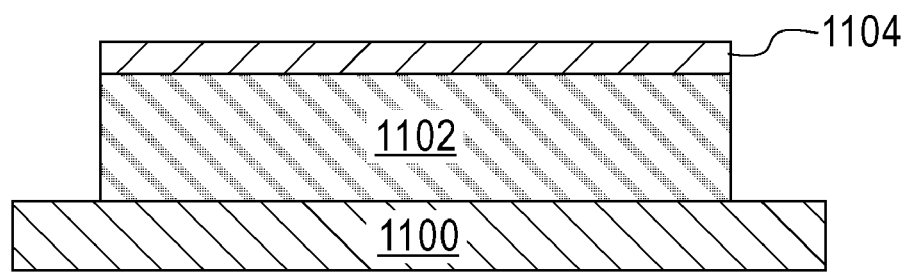
FIGS. 11-12 illustrate side cut-away views of another alternate exemplary method for forming a photodetector device.
Figure 12:
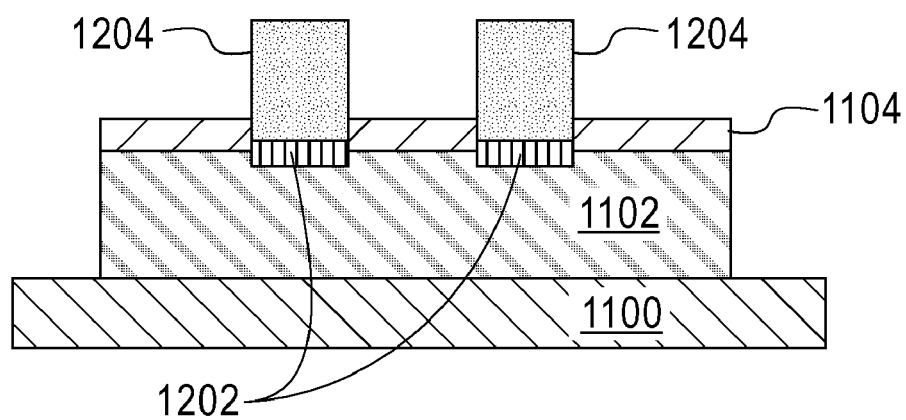

FIGS. 11-12 illustrate side cut-away views of another alternate exemplary method for forming a photodetector device. Referring to FIG. 11, a single crystalline n-type Ge material 1102 is epitaxially grown on a substrate 1100. The substrate 1100 is similar to the substrate 100 (of FIG. 1). The substrate 1100 may include, for example, a single crystalline silicon material such as Si, SiGe, and may be formed as a silicon wave guide chip. The single crystalline n-type Ge material 1102 is doped in-situ with the epitaxy growth. An insulator capping layer 1104 is formed over the layer of single crystalline n-type Ge material 1102. The insulator capping layer 1104 may include, for example, a silicon oxide or silicon nitride material. The insulator capping layer 1104 and single crystalline n-type Ge material 1102 are patterned on the substrate 1100.

FIG. 12 illustrates the resultant structure following the patterning and removal of portions of the insulator layer 1104 to form cavities that expose portions of the single crystalline n-type Ge material 1102. Germanide regions 1202 and electrode material 1204 are formed in a similar manner as described above in FIG. 5.

Figure 13:
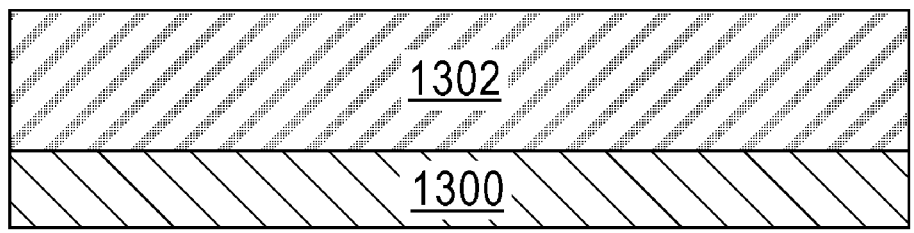
FIGS. 13-15 illustrate side cut-away views of yet another alternate exemplary method for forming a photodetector device.
Figure 14:
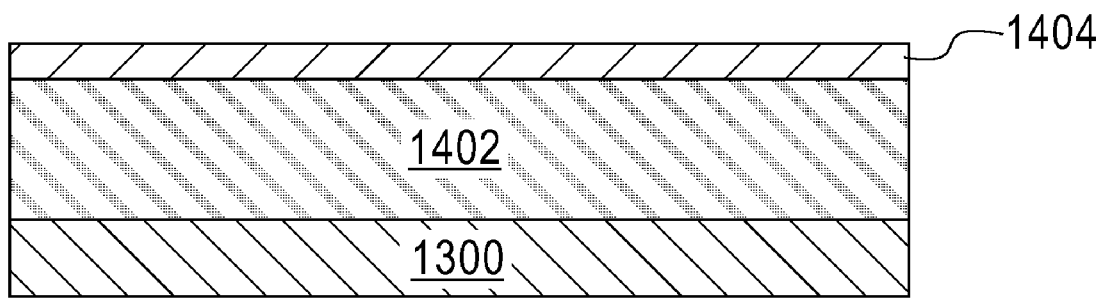
Figure 15:
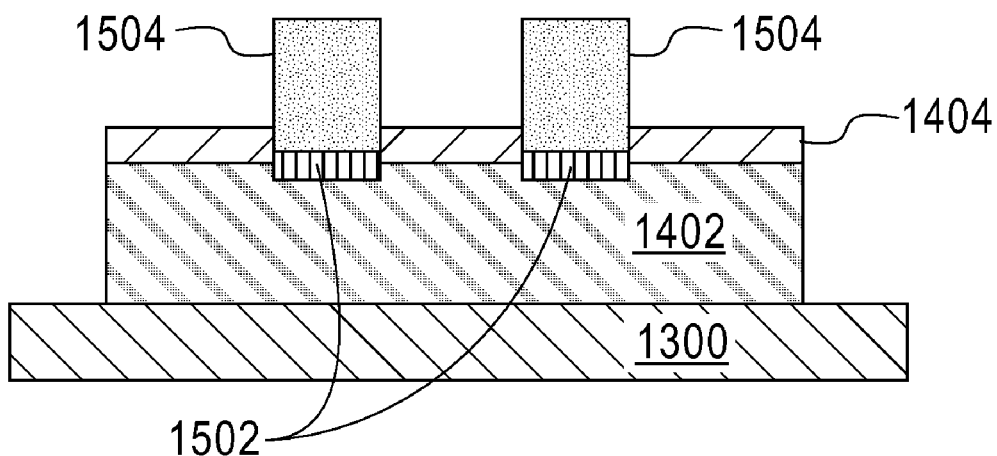

FIGS. 13-15 illustrate side cut-away views of yet another alternate exemplary method for forming a photodetector device. Referring to FIG. 13, a single crystalline Ge material 1302 is epitaxially grown on a substrate 1300. The substrate 1300 is similar to the substrate 100 (of FIG. 1).

FIG. 14 illustrates resultant structure following the formation of an insulator layer 1404 that is formed on the single crystalline Ge material 1302 (of FIG. 13). Once the insulator layer 1404 is formed, n-type ions are implanted and activated in the single crystalline Ge material 1302 to form a single crystalline n-type Ge material 1402. The implantation and activation process may include a similar process as described above in FIG. 9B.

FIG. 15 illustrates germanide regions 1502 and electrode material 104 that are formed in a similar manner as described above in FIG. 5.

FIG. 16 illustrates a block diagram including an exemplary method 1600 for forming a device that is similar to the method described above in FIGS. 1-5. In this regard, in block 1602 a Ge layer is deposited and patterned as shown in FIG. 1. In block 1604, n-type doping is performed either in-situ during growth, or via implantation as shown in FIG. 2. A capping layer is formed in block 1606 as shown in FIG. 3. In block 1608, RMG and activation of the n-type ions is performed as illustrated in FIG. 4. Germanide regions are formed in block 1610 as illustrated in FIG. 5. In block 162, electrodes are formed in the device as shown in FIG. 5.

FIG. 17 illustrates a block diagram including an exemplary method 1700 for forming a device that is similar to the method described above in FIGS. 6-10. In this regard, a Ge layer is deposited and patterned in block 1702 as illustrated in FIG. 6. In block 1704, a capping layer is formed as illustrated in FIG. 6. In block 1706, RMG is performed as shown in FIG. 7. The capping layer is etched in block 1708 as illustrated in FIG. 8. N-type doping implantation and activation is performed in block 1710 and shown in FIG. 9A. In block 1712, germanide regions are formed and in block 1714, electrodes are formed as illustrated in FIG. 10.

FIG. 18 illustrates a block diagram including an exemplary method 1800 for forming a device that is similar to the method described above in FIGS. 11-12. In this regard, in block 1802 an in-situ n-type Ge material is epitaxially formed as illustrated in FIG. 11. An insulating capping layer is formed and patterned in block 1804 as shown in FIG. 11. In block 1806, germanide regions are formed and in block 1808, electrodes are formed as illustrated in FIG. 12.

FIG. 19 illustrates a block diagram that includes an exemplary method 1900 for forming a device that is similar to the method described above in FIGS. 13-15. In this regard, a layer of Ge is epitaxially formed in block 1902 as illustrated in FIG. 13. In block 1904, an insulator layer is formed and n-type dopants are implanted and activated in the Ge layer as illustrated in FIG. 14. In block 1906, the device is patterned, germanide regions are formed in block 1908, and electrodes are formed in block 1910 as illustrated in FIG. 15.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a photodetector device, the method including:
    forming an insulator layer on a substrate;
    forming a germanium (Ge) layer on the insulator layer and a portion of the substrate;
    forming a second insulator layer on the Ge layer;
    implanting n-type ions in the Ge layer;
    patterning the n-type Ge layer;
    forming a capping insulator layer on the second insulator layer and a portion of the first insulator layer;
    heating the device to crystallize the Ge layer resulting in an single crystalline n-type Ge layer; and
    forming electrodes electrically connected to the single crystalline n-type Ge layer.

2. The method of claim 1, wherein the method further includes forming a germanide material between the electrodes and the single crystalline n-type Ge layer.

3. The method of claim 2, wherein the germanide material is formed by depositing a layer of metal on an exposed portion of the single crystalline n-type Ge layer and heating the device to diffuse the metal into the single crystalline n-type Ge layer.

4. The method of claim 3, wherein the layer of metal includes titanium, and the device is heated at a temperature greater than 300° C.

5. A method for forming a photodetector device, the method including:
   forming an insulator layer on a substrate;
   forming a germanium (Ge) layer on the insulator layer and a portion of the substrate;
   forming a second insulator layer on the Ge layer;
   implanting n-type ions in the Ge layer;
   patterning the n-type Ge layer to remove portions of the second insulator layer and the n-type Ge layer;
   forming a capping insulator layer on the second insulator layer and a portion of the first insulator layer;
   heating the device to crystallize the Ge layer resulting in an single crystalline n-type Ge layer; and
   forming electrodes electrically connected to the single crystalline n-type Ge layer.

* * * * *